US012771371B2

(12) United States Patent
Haas et al.

(10) Patent No.: US 12,771,371 B2
(45) Date of Patent: Oct. 20, 2026

(54) DISCRETE TIME AMPLIFIED CHARGE OR VOLTAGE SAMPLER WITH ADJUSTABLE GAIN

(71) Applicant: AIStorm Inc., Houston, TX (US)

(72) Inventors: David Jamie Haas, Houston, TX (US); David Schie, Houston, TX (US)

(73) Assignee: AIStorm Inc., Houston, TX (US)

( * ) Notice: Subject to any disclaimer, the term of this patent is extended or adjusted under 35 U.S.C. 154(b) by 0 days.

(21) Appl. No.: 18/605,751

(22) Filed: Mar. 14, 2024

(65) Prior Publication Data

US 2024/0333295 A1 Oct. 3, 2024

Related U.S. Application Data

(60) Provisional application No. 63/455,343, filed on Mar. 29, 2023.

(51) Int. Cl.

| | |
|---|---|
| ***H03M 1/00*** | (2006.01) |
| ***H03M 1/06*** | (2006.01) |
| ***H03M 1/12*** | (2006.01) |
| ***H03M 1/18*** | (2006.01) |

(52) U.S. Cl.

CPC ......... *H03M 1/183* (2013.01); *H03M 1/0626* (2013.01); *H03M 1/125* (2013.01)

(58) Field of Classification Search

CPC ..... H03M 1/183; H03M 1/0626; H03M 1/125

See application file for complete search history.

(56) References Cited

U.S. PATENT DOCUMENTS

| | | | | |
|---|---|---|---|---|
| 4,636,993 | A * | 1/1987 | Lumley | H03G 3/30 367/47 |
| 10,938,398 | B2 * | 3/2021 | Kim | H03M 1/42 |
| 11,139,820 | B1 * | 10/2021 | Straeussnigg | H03G 3/3089 |
| 11,606,100 | B1 * | 3/2023 | Xu | H03M 3/30 |
| 2020/0186157 | A1 * | 6/2020 | Kim | H04R 19/04 |
| 2022/0385299 | A1 * | 12/2022 | Fon | H03M 1/125 |

FOREIGN PATENT DOCUMENTS

| | | | |
|---|---|---|---|
| EP | 3410129 * | 2/2020 | G01R 27/26 |

* cited by examiner

*Primary Examiner* — Jean B Jeanglaude

(74) *Attorney, Agent, or Firm* — Weiss & Moy, PC; Jeffrey D. Moy

(57) ABSTRACT

An interface output for a capacitive sensor has a circuit to sample an input signal from the capacitive sensor. The circuit converts the sampled input signal to a digital signal and has an adjustable gain. An analog to digital converter (ADC) of the circuit receives the sampled input signal. An output of the circuit is coupled to the ADC and applies a gain correction to generate an amplified digital output signal.

15 Claims, 6 Drawing Sheets

| Gain Mode | Gain Scaler | Pa | SPL | Vrms (mV) | Vpeak (mV) | Sig/Degen SNR rms (dB20) | Peak Degen Current (uA) | Rdegen Thermal Noise Equivalent Bits (-) |
|---|---|---|---|---|---|---|---|---|
| 0 | 1 | 1 | 94 | 11 | 15.6 | 78.7 | 3.1 | 13.1 |
| 0 | 1 | 2 | 100 | 22 | 31.1 | 84.7 | 6.2 | 14.1 |
| 1 | 1/4 | 2 | 100 | 22 | 31.1 | 78.7 | 1.6 | 13.1 |
| 1 | 1/4 | 4 | 106 | 44 | 62.2 | 84.7 | 3.1 | 14.1 |
| 1 | 1/4 | 8 | 112 | 88 | 124.5 | 90.7 | 6.2 | 15.1 |
| 2 | 1/32 | 8 | 112 | 88 | 124.5 | 81.7 | 0.8 | 13.6 |
| 2 | 1/32 | 16 | 118 | 176 | 248.9 | 87.7 | 1.6 | 14.6 |
| 2 | 1/32 | 32 | 124 | 352 | 497.8 | 93.7 | 3.1 | 15.6 |
| 2 | 1/32 | | 127 | 498 | 704.3 | 96.7 | 4.4 | 16.1 |
| 2 | 1/32 | 64 | 130 | 704 | 995.6 | 99.7 | 6.2 | 16.6 |
| 2 | 1/32 | | 132 | 886 | 1252.9 | 101.7 | 7.8 | 16.9 |

FIG. 3

| | VDD = 1.8V | | |
|---|---|---|---|
| Mode | Rs (Kohm) | dB SPL | THD (%) |
| 0 | 5 | 94 | 0.2 |
| 0 | 5 | 100 | 0.6 |
| 1 | 20 | 100 | 0.24 |
| 1 | 20 | 112 | 0.6 |
| 2 | 160 | 112 | 0.3 |
| 2 | 160 | 124 | 0.4 |
| 2 | 160 | 126 | 2.3 |
| 2 | 160 | 127 | 7.2 |

DISCRETE TIME AMPLIFIED CHARGE OR VOLTAGE SAMPLER WITH ADJUSTABLE GAIN

RELATED APPLICATIONS

This patent application is related to U.S. Provisional Application No. 63/455,343 filed Mar. 29, 2023, entitled "A DISCRETE TIME AMPLIFIED CHARGE OR VOLTAGE SAMPLER WITH ADJUSTABLE GAIN", in the names of the present inventors and which is incorporated herein by reference in its entirety. The present patent application claims the benefit under 35 U.S.C § 119(e) of the aforementioned provisional application.

TECHNICAL FIELD

The present application in general relates to analog to digital converters, and more specifically, to a discrete time amplified charge or voltage sampler with adjustable gain.

BACKGROUND

Microphone assemblies may be used in electronic devices to convert acoustic energy to electrical signals. Advancements in micro and nanofabrication technologies have led to the development of progressively smaller micro-electro-mechanical-system (MEMS) microphone assemblies.

Modern MEMs microphone products may consist of a raw MEMs microphone capacitive element that may be coupled to an interface integrated circuit (IC). The interface IC may consist of a charge pump to drive the MEMs element, a sensor interface amplifier and either an output buffer for an analog sensor or an analog to digital converter (ADC) and digital interface for a digital sensor.

Consumer products such as mobile phones, wearables, and hearables (smart earphones) are driving increased demands on lower power MEMs microphone while maintaining or improving audio performance metrics such as, but not limited to: signal to noise ratio (SNR), total harmonic distortion (THD) and acoustic overload point (AOP). SNR may be defined as the ratio of a reference signal to the noise floor of the MEM microphone. A microphone's SNR is the difference between its inherent self-noise level and a standard reference pressure. THD may measure harmonic distortion of the MEM microphone. More specifically, THD may measure the degree to which a MEME microphone alters a pure sinusoidal signal by adding harmonics to the fundamental signal. AOP may be defined as the maximum sound level that the MEM microphone can faithfully capture and is specified in dB sound pressure level (SPL).

Typical MEMs microphone signal path architectures may consist of an ultra-high impedance MOS transistor input which may provide unity buffering to drive either an analog output amplifier or an ADC for digital output microphones. Digital output sensors may be desirable for end applications due to board level noise immunity and direct interface to the digital controller. The traditional architecture approach summarized above may place significant design constraints on the ADC.

The MEMs microphone is a sound-to-electricity transducer which means that any output signal may correspond to a specific sound as input. The equivalent input noise (EIN) may be the acoustic level, expressed in dBSPL, corresponding to the residual noise as output. FIG. 1 may show the acoustic and electrical relationship for a digital microphone. As may be seen in FIG. 1, there is an intrinsic signal to noise ratio (SNR) which defines the noise floor. There may also be a requirement for very large signal inputs with the limit defined as the acoustic overload point (AOP).

The AOP requirement may place the following requirements and constraints on the system:

1. Unity gain on the input amplifier in order to prevent saturation
2. A large dynamic range of the ADC
3. A low noise input of the ADC The AOP requirement may define the effective number of bits required by the ADC in the signal path. Typical ADC requirements can be as high as 18 bits. This requirement may force significant complexity and power consumption on the ADC when designed for the low noise and high dynamic range requirements.

Therefore, it would be desirable to provide a system and method that overcomes the above.

SUMMARY

In accordance with one embodiment, an interface output for a capacitive sensor is disclosed. The interface output has a circuit to sample an input signal from the capacitive sensor, convert the sampled input signal to a digital signal and having an adjustable gain.

In accordance with one embodiment, a circuit to convert one of a charge or voltage information input from a Micro Electro Mechanical (MEM) capacitive sensor is disclosed. The circuit to as a sampling circuit sampling an input signal from the MEM capacitive sensor and converting the sampled input signal to one of amplified charge or voltage information. An analog to digital converter (ADC) receives the one of amplified charge or voltage information. An output device is coupled to the ADC applies a gain correction to generate an amplified digital output signal. An observer is coupled to the sampling circuit determines a magnitude of the one of amplified charge or voltage information and compares the magnitude of the one of amplified charge or voltage information to threshold window values. A controller is coupled to the observer generates a gain control output signal to control and adjust a gain of the one of amplified charge or voltage information.

In accordance with one embodiment, a circuit to convert charge information input from a Micro Electro Mechanical (MEM) capacitive sensor is disclosed. The circuit has a sampling circuit sampling an input signal from the MEM capacitive sensor and converting the sampled input signal to amplified charge information. An analog to digital converter (ADC) receives the amplified charge information. An output coupled to the ADC applies a gain correction to generate an amplified digital output signal.

BRIEF DESCRIPTION OF THE DRAWINGS

The present application is further detailed with respect to the following drawings. These figures are not intended to limit the scope of the present invention but rather illustrate certain attributes thereof.

FIG. 3 is an exemplary gain scaler table used for an input amplified charge sampler device used in the circuit of FIG. 1 in accordance with one aspect of the present application;

DESCRIPTION OF THE APPLICATION

The description set forth below in connection with the appended drawings is intended as a description of presently preferred embodiments of the disclosure and is not intended to represent the only forms in which the present disclosure can be constructed and/or utilized. The description sets forth the functions and the sequence of steps for constructing and operating the disclosure in connection with the illustrated embodiments. It is to be understood, however, that the same or equivalent functions and sequences can be accomplished by different embodiments that are also intended to be encompassed within the spirit and scope of this disclosure.

Embodiments of the exemplary system and method may eliminate the full range requirement of an ADC for use in a digital output sensor system. The system and method provide a high sample rate input charge amplifier with cycle-by-cycle gain adjustment capability. In accordance with an embodiment, the below discussion relates to an audio MEMs microphone. As previously discussed, the design and implementation of an audio MEMs microphone signal path ADC requires low distortion with a very large dynamic range.

With the ability to dynamically adjust the input gain, the following benefits may be enabled:

1. The input amplifier noise floor may be set to maximize SNR at low signal inputs (benchmark measurement at 94 dB SPL input with 1 KHz tone).
2. The input amplifier noise may be allowed to increase for larger input signals while maintaining the signal to noise ration requirement.
3. The input amplifier gain may be much greater than unity for small input signals, thus significantly reducing the power of the ADC due to input ADC noise requirements relaxed.
4. The ADC effective bits requirement may be significantly reduced to only be slightly greater than the SNR (such as 12-bit ADC instead of 18-bit ADC).

An aspect of this invention is the cycle-by-cycle processing nature. This may eliminate the digital filter state memory often associated with noise shaping delta-sigma ADC's used in MEMs microphone audio applications. In this invention, the lower resolution data-conversion is Nyquist rate, meaning a conversion independently occurs during each cycle. This allows for seamless transitions between low and normal power modes with no discontinuity.

The sample rate of this system should be placed sufficiently high relative to the maximum audio frequency. A factor of 10 would yield a sample rate of >200 KHz.

Figure 2:
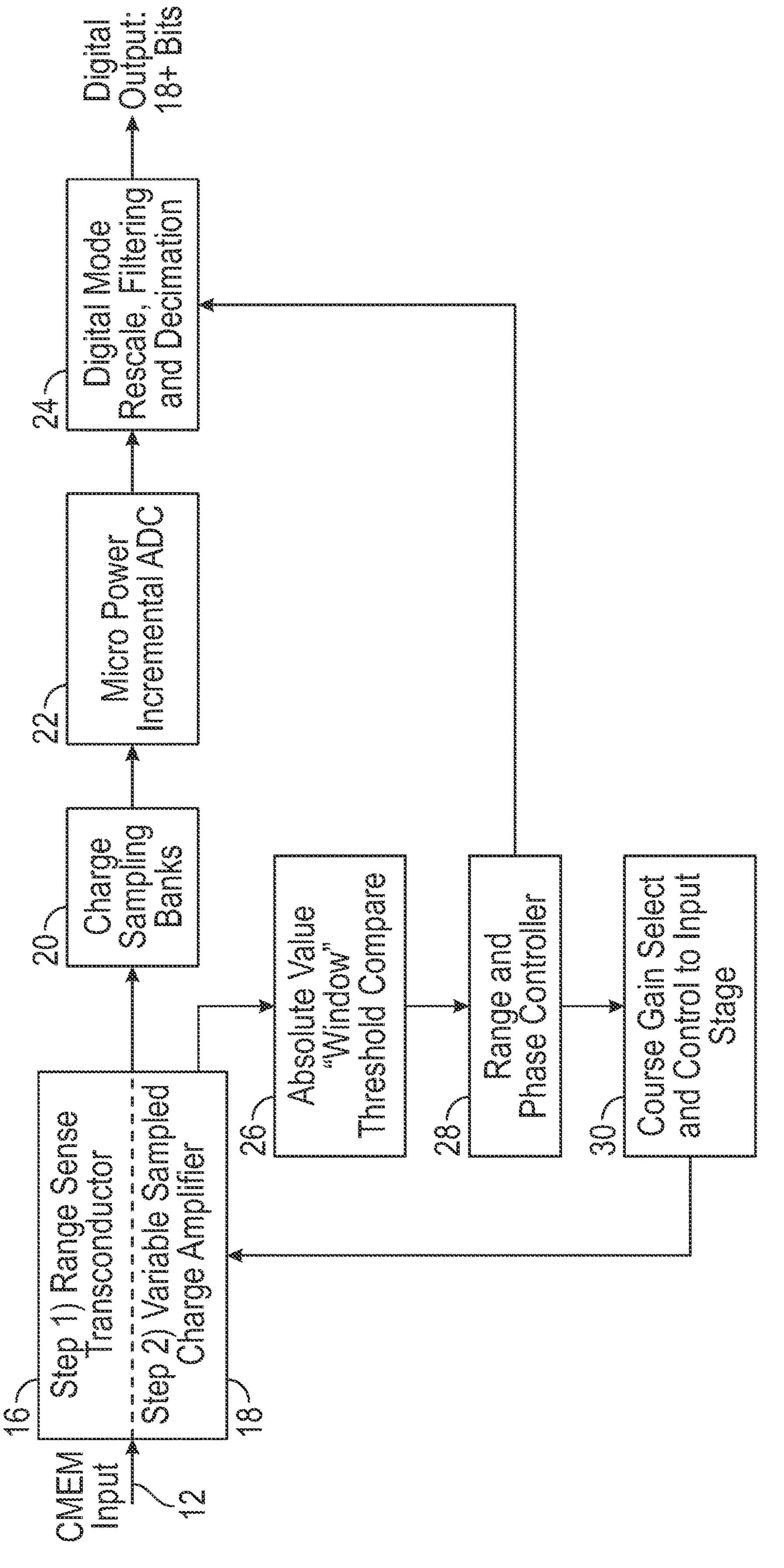
FIG. 2 is a simplified block diagram of an exemplary discrete time amplified charge or voltage sampler with adjustable gain circuit according to one aspect of the present application.
Figure 4:
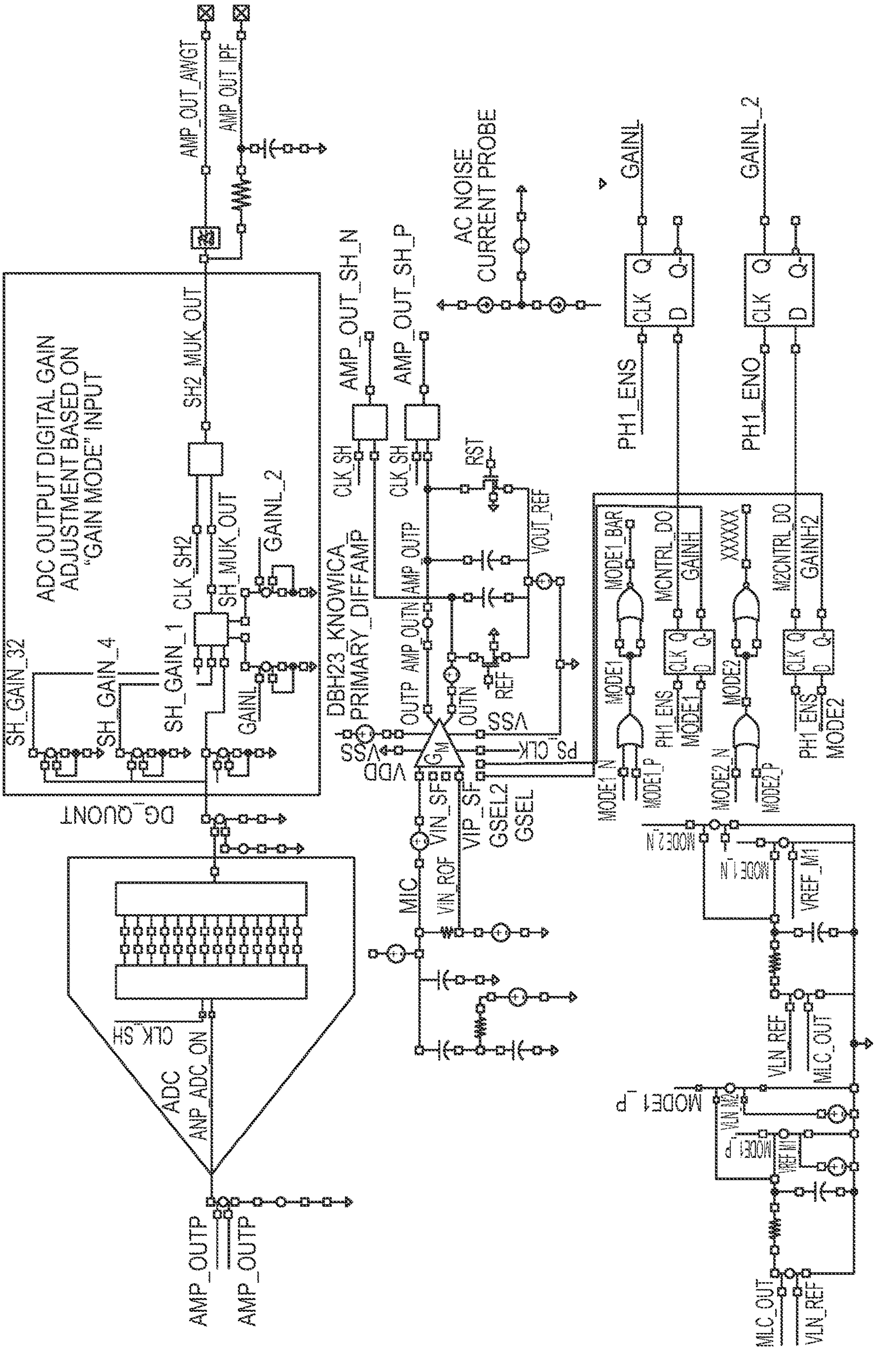
FIG. 4 is an electrical schematic of an exemplary circuit of FIG. 1 in accordance with one aspect of the present application.

Referring to FIG. 2, an implementation of an embodiment of the present disclosure may be seen. In this embodiment, a discrete time amplified charge or voltage sampler with adjustable gain circuit 10 may be shown. The circuit 10 may be coupled to a capacitive sensor 12. In accordance with one embodiment, the capacitive sensor 12 may be a MEMs sensor. The circuit 10 may be able to generate an 18-bit digital output with an ADC consisting of 12 bits resolution.

The circuit 10 may have a sampling circuit 14. The sampling circuit 14 may be used to take a sample of the input signal from the capacitive sensor 12. In accordance with one embodiment, the sampling circuit 14 may be formed of a transconductor 16. The transconductor 16 may receive the input signal from the capacitive sensor 12. The transconductor 16 may be used to perform a voltage-to-current conversion of the input signal. A sampler circuit 18 may then take a sample of the converted input signal. The sampler circuit 18 may be a sample and hold circuit that takes a sample of the converted input signal and stores the sample as a voltage or a charge. In accordance with one embodiment, the sampler circuit 18 may take the sample and amplify the sample of the converted input signal. The amplified sample may be sent to a sampling bank 20, to an ADC 22 and then to an output device 24. The output device 24 which may produce a digital or pulse density modulation (PDM) response for use by a digital system. In accordance with one embodiment, the ADC 22 may be a nyquist rate ADC. The output device 24 may be a digital range scaling block that is coupled to the output of the ADC 26, receives input from an observer 26 and applies an inverse gain correction algorithm to reconstruct the amplified signal in digital format.

An observer 26 may be coupled to the sampler circuit 18. The observer 26 may be used to determine an instantaneous magnitude of the amplified sample generated by the sampler circuit 18 and then compare the instantaneous signal magnitude to threshold window values. A controller 28 may receive the values from the observer 26 and provides an output to control the adjustable gain of the amplified sample. The controller 28 may send the output to a digital range scaling and reconstruction block of the output device 24 to control the adjustable gain of the amplified charge sample. The output device 24 may receive the input from the ADC 22 and the controller 28. The output device 24 may apply an inverse gain correction algorithm to reconstruct the amplified signal in digital format. A course gain select and control device 30 may be coupled to the controller 28. The course gain select and control device 30 may adjust an input gain of the circuit 10.

Referring to FIG. 3, an exemplary embodiment of a gain scaler table may be seen. The gain scaler table may be used for the input of the charge sampling device 16. Gain mode 0 is the nominal highest gain for audio signals that are below the 100 dB SPL level. The gain is normalized to 1 while Gain Mode 1 and 2 are binary fractional values that reduce the input gain for larger input signals.

Digital reconstruction on a cycle-by-cycle basis simply requires the inverse gain application after the analog to digital conversion. In this example, Gain Mode 1 would set the appropriate signal from the controller to set the digital gain correction as 4 to correct for the ¼ input scale. This gain correction is easily implemented.

Figure 5:
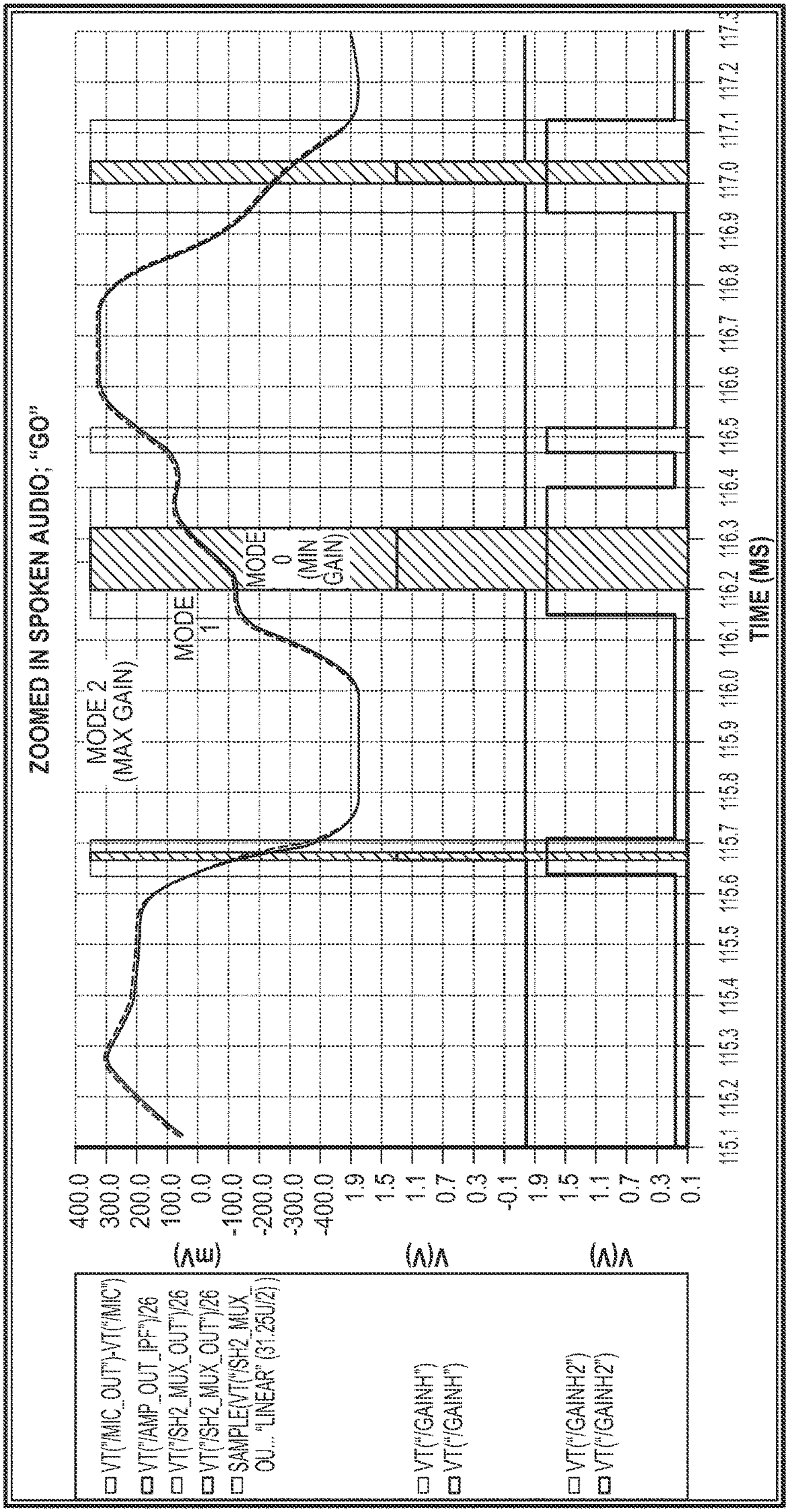
FIG. 5 depicts input audio waveform overlayed on the reconstructed digital equivalent with Mode 1 and Mode 2 gain transitions using the exemplary circuit of FIG. 1 in accordance with one aspect of the present application.

FIG. 5 shows the input audio waveform overlayed on the reconstructed digital equivalent with Mode 1 and Mode 2 gain transitions.

Figure 1:
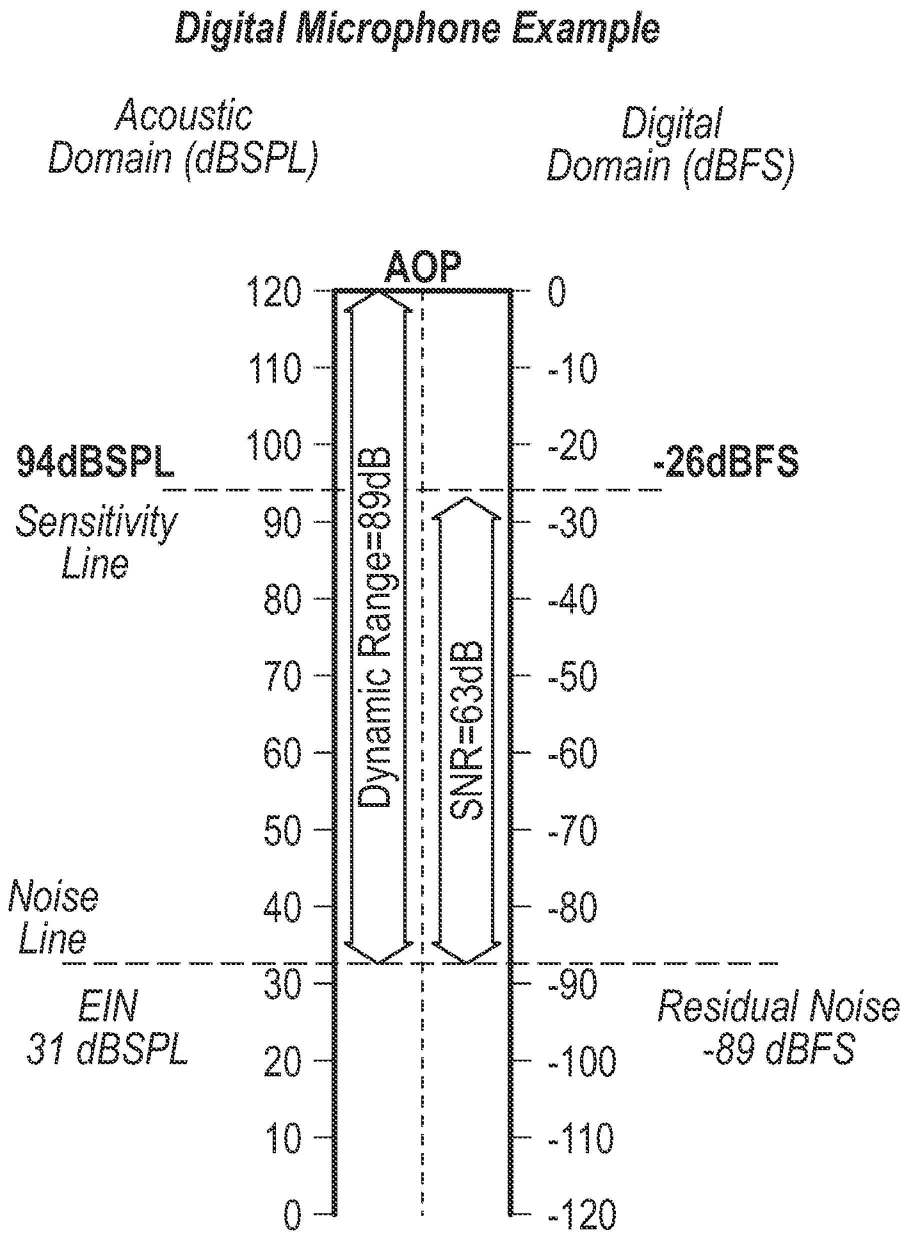
FIG. 1 is a chart showing acoustic and electrical relationship for a digital microphone in accordance with one aspect of the present application.
Figure 6:
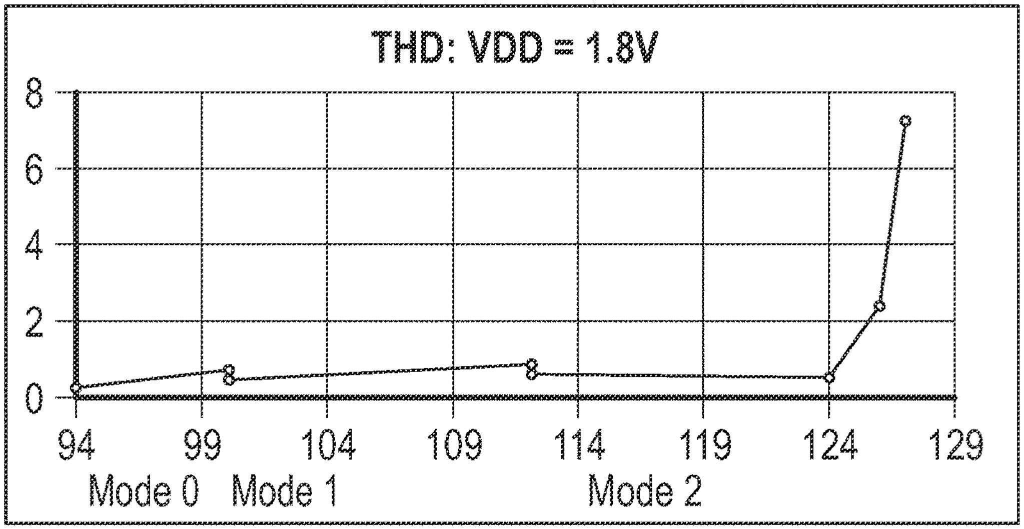
FIG. 6 shows simulation results for THD while the input signal is exercised through the full range of inputs up to the AOP using the exemplary circuit of FIG. 1 in accordance with one aspect of the present application.

FIG. 6 shows simulation results for THD while the input signal is exercised through the full range of inputs up to the AOP as described in FIG. 1.

The foregoing description is illustrative of particular embodiments of the invention but is not meant to be a limitation upon the practice thereof. The following claims, including all equivalents thereof, are intended to define the scope of the invention.

What is claimed is:

1. An interface output for a capacitive sensor comprising:
   a circuit to sample an input signal from the capacitive sensor, convert the sampled input signal to a digital signal and having an adjustable gain, wherein circuit comprises:
   an analog to digital converter (ADC) receiving the sampled input signal;
   an output coupled to the ADC applying a gain correction to generate an amplified digital output signal; and
   an observer coupled to the capacitive sensor determining a magnitude of amplified sample of the input signal.

2. The circuit of claim 1, wherein the capacitive sensor is a MEMs sensor.

3. The circuit of claim 1, wherein the circuit comprises a sampling circuit coupled to the capacitive sensor taking a sample of the input signal and amplifying the sample of the input signal.

4. The circuit of claim 1, wherein the observer coupled to the capacitive sensor determining an instantaneous magnitude of the amplified sample of the input signal and comparing the instantaneous magnitude of the amplified sample of the input signal to threshold window values.

5. The circuit of claim 1, comprising a controller coupled to the observer and generating an output to control and adjusting a gain of the amplified sample.

6. The circuit of claim 1, wherein the output device comprises a digital range scaling and reconstruction block, the controller sending the output to the digital range scaling and reconstruction block to adjust the gain of the amplified sample.

7. The circuit of claim 1, wherein the ADC is a nyquist rate ADC.

8. A circuit to convert one of a charge or voltage information input from a Micro Electro Mechanical (MEM) capacitive sensor comprising:
   a sampling circuit sampling an input signal from the MEM capacitive sensor and converting the sampled input signal to one of amplified charge or voltage information;
   an analog to digital converter (ADC) receiving the one of amplified charge or voltage information;
   an output device coupled to the ADC applying a gain correction to generate an amplified digital output signal;
   an observer coupled to the sampling circuit determining a magnitude of the one of amplified charge or voltage information and comparing the magnitude of the one of amplified charge or voltage information to threshold window values; and
   a controller coupled to the observer generating a gain control output signal to control and adjust a gain of the one of amplified charge or voltage information.

9. The circuit of claim 8, wherein the output device comprises a digital range scaling and reconstruction block, the controller sending the gain control output signal to the digital range scaling and reconstruction block.

10. The circuit of claim 8, wherein the ADC is a nyquist rate ADC.

11. A circuit to convert charge information input from a Micro Electro Mechanical (MEM) capacitive sensor comprising:
   a sampling circuit sampling an input signal from the MEM capacitive sensor and converting the sampled input signal to amplified charge information;
   an analog to digital converter (ADC) receiving the amplified charge information;
   an output coupled to the ADC applying a gain correction to generate an amplified digital output signal; and
   an observer coupled to the sampling circuit determining a magnitude of the amplified charge information.

12. The circuit of claim 11, wherein circuit comprises an observer coupled to the MEM capacitive sensor determining an instantaneous magnitude of the amplified charge information and comparing the instantaneous magnitude of the amplified charge information to threshold window values.

13. The circuit of claim 12, comprising a controller coupled to the observer generating an output to control and adjusting a gain of the amplified sample.

14. The circuit of claim 13, wherein the output device comprises a digital range scaling and reconstruction block, the controller sending the output to the digital range scaling and reconstruction block to adjust the gain.

15. The circuit of claim 11, wherein the ADC is a nyquist rate ADC.

* * * * *